(12) United States Patent
Mori et al.

(10) Patent No.: US 12,148,637 B2
(45) Date of Patent: Nov. 19, 2024

(54) SUBSTRATE PROCESSING APPARATUS

(71) Applicant: Tokyo Electron Limited, Tokyo (JP)

(72) Inventors: Kiyoshi Mori, Fuchu (JP); Satoru Kawakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 326 days.

(21) Appl. No.: 17/577,503

(22) Filed: Jan. 18, 2022

(65) Prior Publication Data
US 2022/0230896 A1 Jul. 21, 2022

(30) Foreign Application Priority Data

Jan. 21, 2021 (JP) .................................. 2021-007698
Jun. 10, 2021 (JP) .................................. 2021-097486

(51) Int. Cl.
*H01L 21/67* (2006.01)
*C23C 16/44* (2006.01)
*H01L 21/677* (2006.01)
*H01L 21/687* (2006.01)

(52) U.S. Cl.
CPC .... *H01L 21/67184* (2013.01); *C23C 16/4412* (2013.01); *H01L 21/67742* (2013.01); *H01L 21/68764* (2013.01)

(58) Field of Classification Search
CPC ......... H01L 21/68742; H01L 21/68764; H01L 21/67017; H01L 21/68771; H01L 21/67184; H01L 21/68792; H01L 21/67742; H01L 21/67115; H01L 21/68785; H01L 21/68167; H01L 21/67167; C23C 16/4584; C23C 16/4412
See application file for complete search history.

(56) References Cited

U.S. PATENT DOCUMENTS

| | | | |
|---|---|---|---|
| 10,689,753 B1* | 6/2020 | Finley | C23C 16/045 |
| 2010/0184290 A1* | 7/2010 | Kim | H01L 21/68742 |
| | | | 118/728 |
| 2018/0272376 A1* | 9/2018 | Abe | H01L 21/68728 |
| 2019/0103301 A1* | 4/2019 | Tashiro | H01L 21/68792 |
| 2022/0305601 A1* | 9/2022 | Chandrasekharan | |
| | | | B25B 11/005 |

FOREIGN PATENT DOCUMENTS

| | | |
|---|---|---|
| JP | 2009-041790 A | 2/2009 |
| JP | 2019-220509 A | 12/2019 |
| KR | 10-2009-0083255 A | 8/2009 |

* cited by examiner

*Primary Examiner* — Glenn F Myers
(74) *Attorney, Agent, or Firm* — Armstrong Teasdale LLP

(57) ABSTRACT

A substrate processing apparatus includes a vacuum processing container and a rotation arm including a rotary axis disposed at a central portion of the vacuum processing container, wherein, in the rotation arm, a rotation cylinder having a hollow interior constitutes the rotary axis, and a hollow portion of the rotation cylinder constitutes an exhaust path of the vacuum processing container.

13 Claims, 8 Drawing Sheets

SUBSTRATE PROCESSING APPARATUS

CROSS-REFERENCE TO RELATED APPLICATIONS

This application is based upon and claims the benefit of priority from Japanese Patent Application Nos. 2021-007698 filed on Jan. 21, 2021 and 2021-097486 filed on Jun. 10, 2021, the entire contents of which are incorporated herein by reference.

TECHNICAL FIELD

The present disclosure relates to a substrate processing apparatus.

BACKGROUND

In a depressurization drying apparatus, it is proposed to weld reinforcement ribs to extend in a direction intersecting adjacent edge portions of a chamber cover having a quadrilateral shape, so as to suppress deformation of the chamber cover during depressurization, thereby suppressing separation or the like of the welded portion (Patent Document 1). In addition, as a substrate processing apparatus for processing a substrate (hereinafter, also referred to as a "wafer") in a substrate processing system, a substrate processing apparatus which processes four wafers in one chamber at the same time is known (Patent Document 2).

PRIOR ART DOCUMENTS

Patent Documents

Patent Document 1: Japanese Laid-Open Patent Publication No. 2009-041790
Patent Document 2: Japanese Laid-Open Patent Publication No. 2019-220509

SUMMARY

According to one embodiment of the present disclosure, there is provided a substrate processing apparatus including: a vacuum processing container; and a rotation arm including a rotary axis disposed at a central portion of the vacuum processing container, wherein, in the rotation arm, a rotation cylinder having a hollow interior constitutes the rotary axis, and a hollow portion of the rotation cylinder constitutes an exhaust path of the vacuum processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a substrate processing apparatus according to the present disclosure will be described in detail based on the drawings. The technology disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the substrate processing apparatus that processes four wafers in one chamber at the same time as described above, a joined exhaust path in which exhaust paths from respective wafer processing spaces are joined with each other is provided in the central portion (central region) of the substrate processing apparatus. When a rotation arm is provided in the central portion of the chamber in order to transfer wafers among the respective processing spaces, the exhaust paths are provided in the outer peripheries of the respective processing spaces and are joined with each other at the lower portion of the chamber, thereby causing an increase in the volume of the chamber and the complication in exhaust path. In addition, in this configuration, since a beam cannot be installed in the central portion of the chamber, the central portion of the chamber in the vacuum atmosphere may be deformed by the atmospheric pressure, which may affect the process performance in each processing space. Thus, it is desired to achieve both the installation of the rotation mechanism of the rotation arm in the central portion of a vacuum processing container (chamber), and the simplification of an exhaust path. Further, it is desired to suppress the deformation of the vacuum processing container

[Configuration of Substrate Processing Apparatus]

Figure 1:
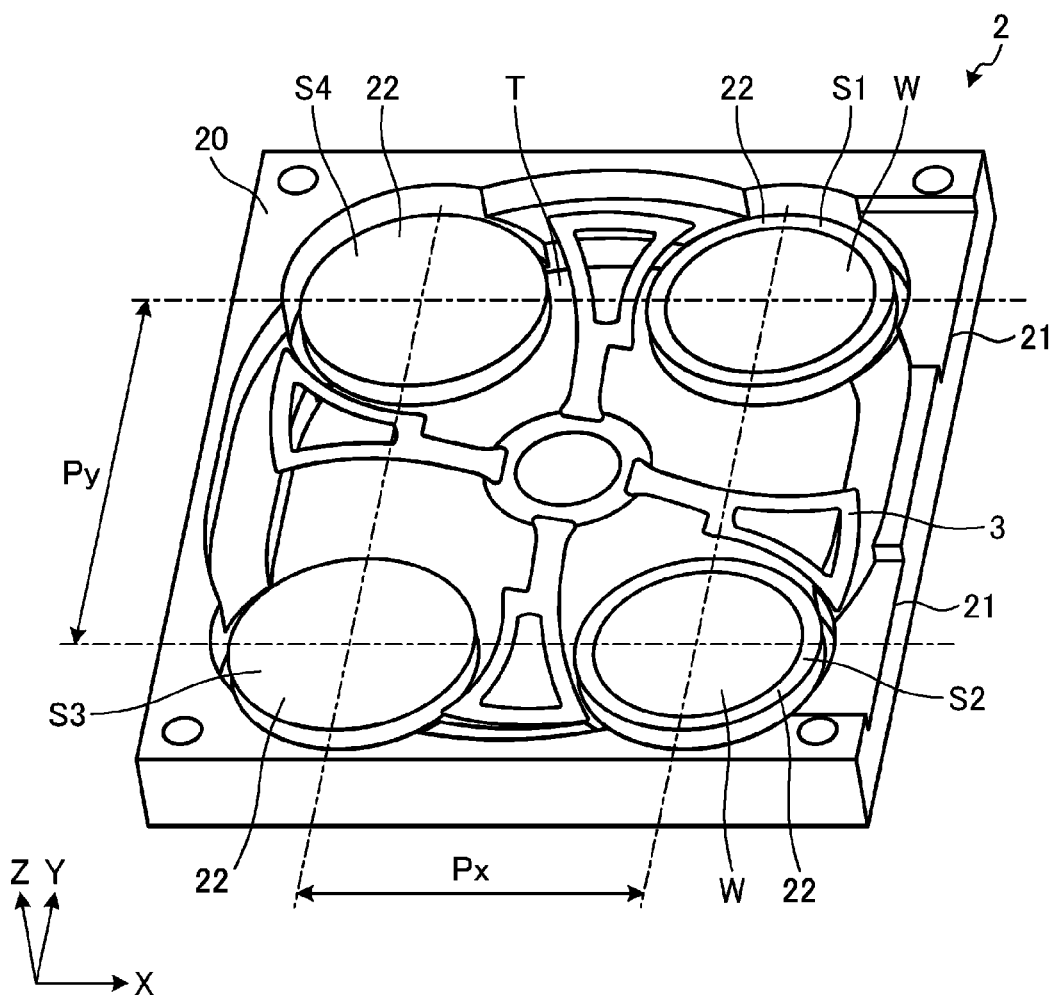
FIG. 1 is an exploded perspective view illustrating an example of a configuration of a substrate processing apparatus according to an embodiment of the present disclosure.

FIG. 1 is an exploded perspective view illustrating an example of a configuration of a substrate processing apparatus according to an embodiment of the present disclosure. In the present embodiment, descriptions will be made on an example in which a substrate processing apparatus 2 illustrated in FIG. 1 is applied to, for example, a film forming apparatus which performs plasma chemical vapor deposition (CVD) on a wafer W. The substrate processing apparatus 2 is an example of a process module and a vacuum processing apparatus. As illustrated in FIG. 1, the substrate processing apparatus 2 includes a processing container (vacuum container) 20 having a rectangular shape in a plan view. The processing container 20 is configured to maintain the interior thereof in a vacuum atmosphere. That is, the processing container 20 is an example of a vacuum processing container. The processing container 20 is configured by closing a top open portion with a gas supplier 4 and a manifold 36 to be described later. In FIG. 1, internal partition walls and the like are omitted such that a relationship between the processing spaces S1 to S4 and a rotation arm 3 can be easily understood. The processing container 20 is provided with two carry-in/out ports 21 arranged in a Y direction in a side surface thereof connected to a vacuum transfer chamber (not illustrated). The carry-in/out ports 21 are opened and closed by gate valves (not illustrated).

A plurality of processing spaces S1 to S4 are provided inside the processing container 20. Stages 22 are disposed in the processing spaces S1 to S4, respectively. The stages 22 are movable vertically, so that the stages 22 move upward when wafers W are processed, and move downward when wafers W are transferred. A transfer space T is provided below the processing spaces S1 to S4, to be connected to the processing spaces S1 to S4 for transferring wafers W by the rotation arm 3. The transfer space T below the processing spaces S1 and S2 is connected to each of the carry-in/out ports 21, and wafers W are carried in/out between the processing container and the vacuum transfer chamber by a substrate transfer mechanism (not illustrated). In order to collectively transfer two wafers W to the substrate processing apparatus 2, a substrate holder of the substrate transfer mechanism is configured to hold, for example, two wafers W at the same time.

The respective stages 22 of the processing spaces S1 to S4 are arranged in a two-row and two-column layout when viewed from the above. The layout has different dimensions for row and column intervals. That is, a pitch Py, which is a pitch in the Y-direction between the stages 22 (row interval), and a pitch Px1, which a pitch in an X-direction between the stages 22 (column interval), have a relationship of Py>Px1.

Figure 2:
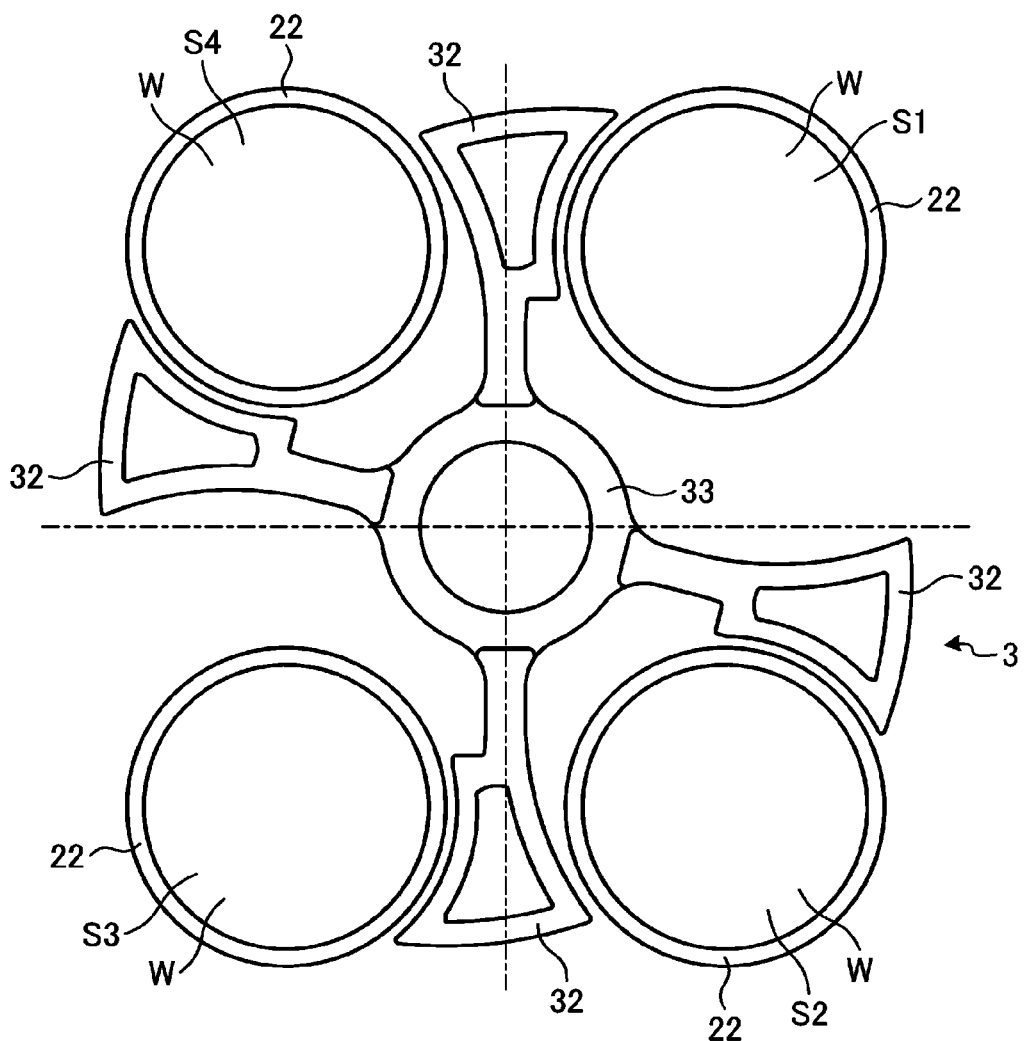
FIG. 2 is a view illustrating an example of a positional relationship between a processing space and a rotation arm at a standby position.
Figure 3:
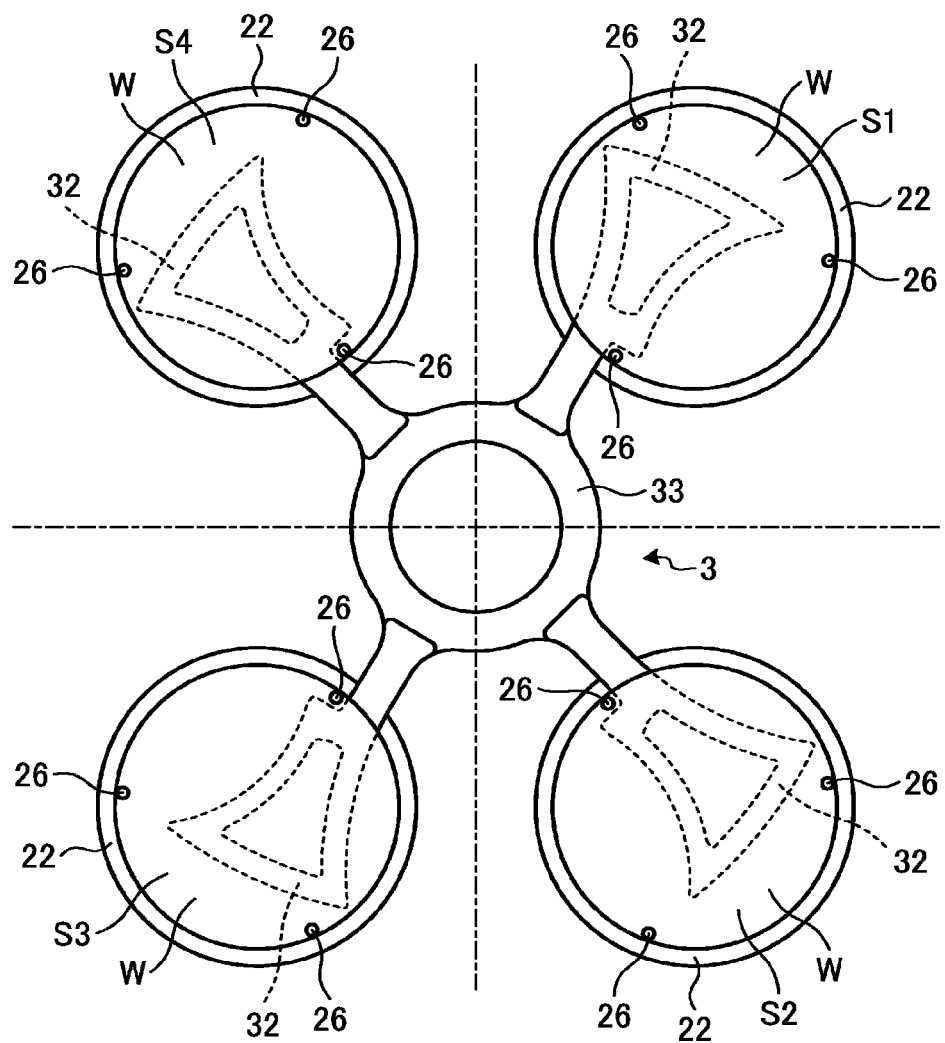
FIG. 3 is a view illustrating an example of the positional relationship between the processing space and the rotation arm at a wafer holding position.

FIG. 2 is a view illustrating an example of a positional relationship between the processing spaces and the rotation arm at a standby position. FIG. 3 is a view illustrating an example of the positional relationship between the processing space and the rotation arm at a wafer holding position. As illustrated in FIGS. 2 and 3, the rotation arm 3 includes four end effectors 32 capable of holding wafers W to be placed on the stages 22, respectively, and a base member 33 having a rotation axis at the center position of the two-row and two-column layout. The four end effectors 32 are connected to the base member 33 to form an X shape. That is, the rotation arm 3 includes the same number of end effectors 32 as the number of processing spaces S1 to S4. The X shape of the rotation arm 3 has a configuration in which the dimension in the Y direction corresponding to the row interval of the X shape and the dimension in the X direction corresponding to the column interval of the X shape differ from each other at the wafer holding position illustrated in FIG. 3.

At the standby position illustrated in FIG. 2, each end effector of the rotation arm 3 is disposed between two of the processing spaces S1 to S4, so that the rotation arm 3 does not disrupt the vertical movement of each stage 22. FIG. 2 illustrates a state in which wafers W are placed on the stages 22, respectively. A description will be made of the movement of the rotation arm 3 when the wafers W are transferred such that the wafers W in the first column and the wafers W in the second column are interchanged from this state, that is, when the wafers W in the processing spaces S1 and S2 are transferred to the processing spaces S3 and S4, and the wafers W in the processing spaces S3 and S4 are transferred to the processing spaces S1 and S2.

First, respective stages 22 are moved to delivery positions in the transfer space T at the lower side, and lift pins 26 (to be described later) provided on the respective stages 22 are raised to lift the wafers W. Subsequently, the rotation arm 3 is rotated clockwise by about 30 degrees to insert respective end effectors 32 between the stages 22 and the wafers W as illustrated in FIG. 3. Subsequently, the lift pins 26 are lowered to place the wafers W on respective end effectors 32. Subsequently, the rotation arm 3 is rotated clockwise by 180 degrees to transfer the wafers W to holding positions on respective stages 22. When the respective stages 22 raise the lift pins 26 to receive the wafers W, the rotation arm 3 is rotated counterclockwise by about 30 degrees to move to the standby position. In this way, the wafers W can be transferred by the rotation arm 3 such that the wafers W in the first column and the wafers W in the second column are interchanged with each other. Therefore, for example, when different processes are repeated in the processing spaces S1 and S2 and the processing spaces S3 and S4 (e.g., when a film forming process and an annealing process are repeated), the time required to transfer the wafers W can be reduced.

Figure 4:
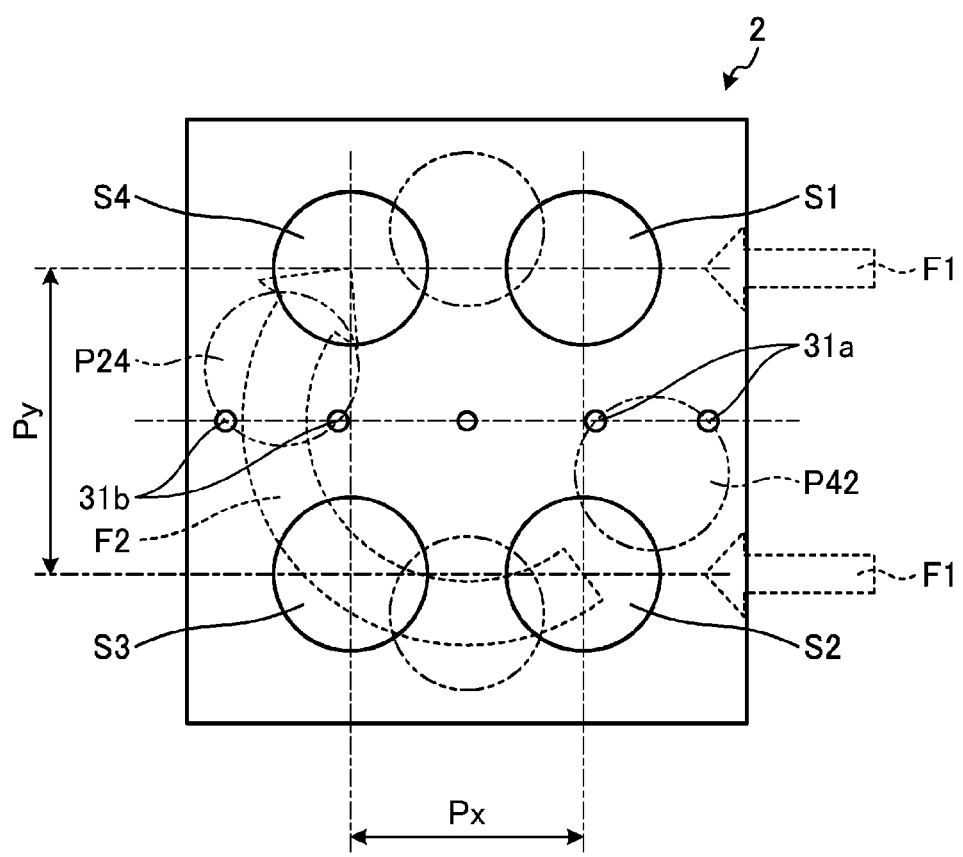
FIG. 4 is a view illustrating an example of a moving path of wafers in the substrate processing apparatus of the present embodiment.

FIG. 4 is a view illustrating an example of wafer movement paths in the substrate processing apparatus of the present embodiment. In FIG. 4, the movement paths when the wafers W are transferred from the vacuum transfer chamber to the interior of the substrate processing apparatus 2 will be described. First, by a substrate transfer mechanism (not illustrated) of the vacuum transfer chamber, as illustrated by a path F1, at the delivery positions of the transfer space T under the processing spaces S1 and S2 corresponding to the stages 22 in the same column, two wafers W are simultaneously loaded into respective stages 22. The respective stages 22 of the processing spaces S1 and S2 raise the lift pins 26 to receive the wafers W.

Subsequently, the rotation arm 3 is rotated clockwise from the standby position by about 30 degrees, the end effectors 32 are inserted between the stages 22 located at the delivery positions under the processing spaces S1 and S2 and the wafers W, respectively, and the lift pins 26 are lowered to place the wafers W on the respective end effectors 32. When the wafers W are placed, the rotation arm 3 is rotated clockwise by 180 degrees as illustrated by a path F2 to transfer the wafers W onto the stages 22 located at the delivery positions (the holing positions of the rotation arm 3) of the transfer space T under the processing spaces S3 and S4. When the stages 22 located at the delivery positions under the processing spaces S3 and S4 raise the lift pins 26 to receive the wafers W, respectively, the rotation arm 3 is rotated counterclockwise by about 30 degrees to move to the standby position. In this state, no wafers W are placed on the stages 22 of the processing spaces S1 and S2, but the wafers W are placed on the stages 22 of the processing spaces S3 and S4. Subsequently, as illustrated by the path F1, two wafers W are simultaneously loaded into respective stages 22 at the delivery positions located under the processing spaces S1 and S2 by the substrate transfer mechanism of the vacuum transfer chamber, and the wafers W are placed on the stages 22 of the processing spaces S1 and S2, whereby the wafers W are placed on all of the stages 22 of the processing spaces S1 to S4, respectively.

Similarly, during unloading, the wafers W placed on the stages 22 located at the delivery positions under the processing spaces S1 and S2 are first transferred to the vacuum transfer chamber by the substrate transfer mechanism. Subsequently, the wafers W placed on the stages 22 located at the delivery positions under the processing spaces S3 and S4 are transferred by the rotation arm 3 to the stages 22 located at the delivery positions under the processing spaces S1 and S2. Subsequently, the wafers W placed on the stages 22 located at the delivery positions under the processing spaces S1 and S2 are transferred to the vacuum transfer chamber by the substrate transfer mechanism. In this way, by using the substrate transfer mechanism capable of simultaneously transferring two wafers W and the rotation arm 3, the wafers W can be loaded into and unloaded from the processing spaces S1 to S4.

When the rotation arm 3 transfers the wafers W, the deviations of the wafers W from the stages 22 of a transfer destination may be detected, and the stages 22 may be finely moved in the XY plane to correct the deviation of the wafers W. In this case, the substrate processing apparatus 2 includes a deviation detection sensor configured to detect a deviation of each wafer W at each of rotationally symmetric positions within the row interval or the column interval, on the rotation trajectory of the wafers W held by the rotation arm 3. In the example of FIG. 4, sensors 31a and 31b are provided between the processing spaces S1 and S2 and between the processing spaces S3 and S4, respectively, within the row interval.

Each of the sensors 31a and 31b is, for example, a set of two optical sensors, which are arranged on a straight line in the X direction that passes through the center of the substrate processing apparatus 2, that is, the center position of the two-row and two-column layout. This is to make the direction of expansion of the processing container 20 caused by a thermal expansion the same in the two sensors, thereby reducing an error. The arrangement positions of the sensors 31a and 31b are not limited to the X direction as long as the positions are on a straight line passing through the center of the substrate processing apparatus 2. The substrate processing apparatus 2 detects deviation amounts of the wafers W by comparing front and rear edges of the wafers W detected by the sensors 31a and 31b with output results of an encoder (not illustrated) provided in the rotation arm 3.

In the example of FIG. 4, a position P24 represents a state in which the rear edge of the wafer W passes through the sensor 31b when the wafer W is transferred from the processing space S2 to the processing space S4, and a position P42 represents a state in which the rear edge of the wafer W passes through the sensor 31a when the wafer W is transferred from the processing space S4 to the processing space S2. The substrate processing apparatus 2 may finely move the stages 22 within the XY plane according to a detected deviation amount to correct the deviations of the wafers W. That is, the substrate processing apparatus 2 adjusts the deviations such that the wafers W are located at the centers of the processing spaces S1 to S4, respectively, when the stages 22 are raised. The term "finely" used herein refers to about 5 mm or less.

Figure 5:
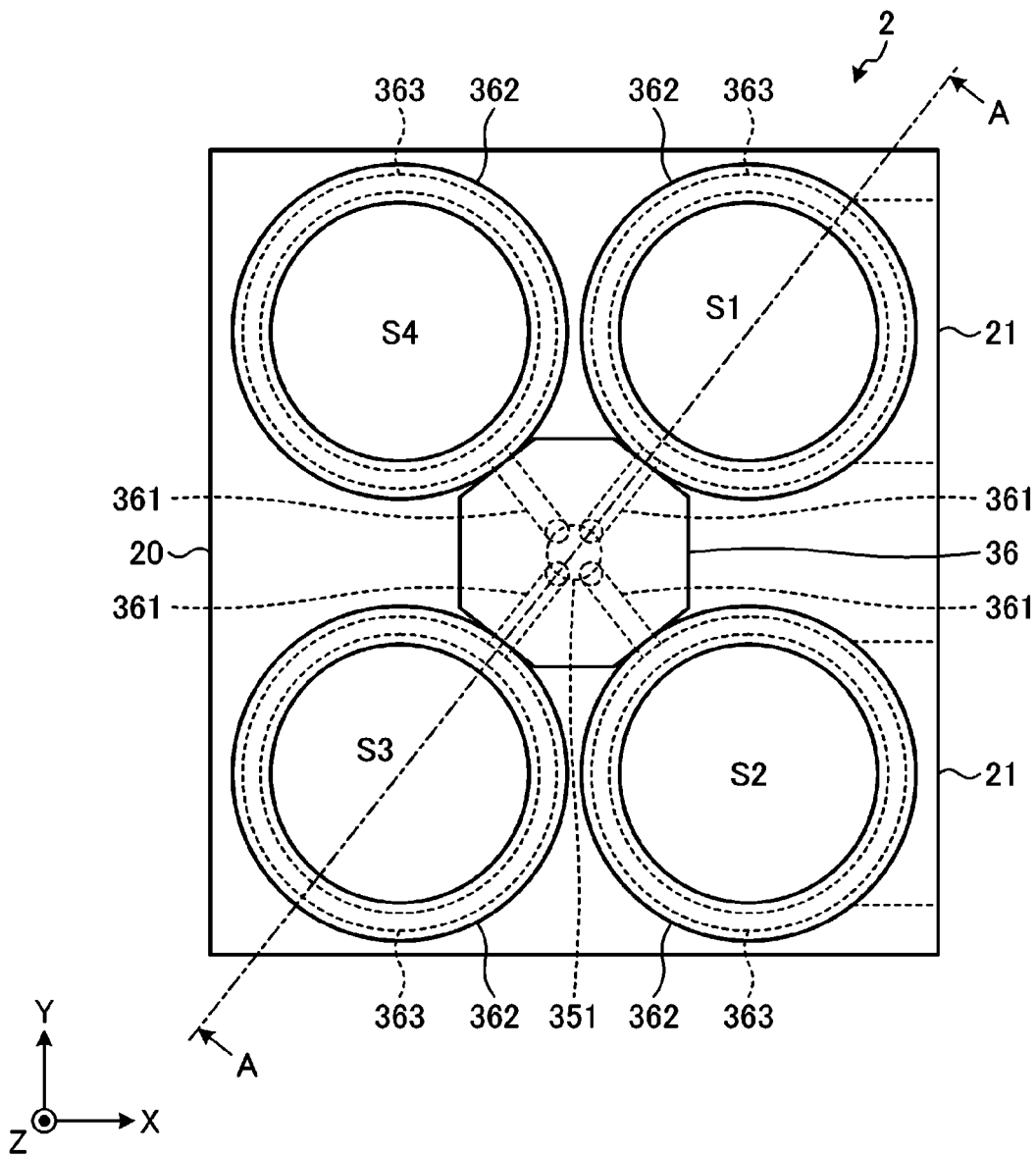
FIG. 5 is a view illustrating an example of an exhaust path of the substrate processing apparatus of the embodiment.

FIG. 5 is a view illustrating an example of exhaust paths of the substrate processing apparatus in the present embodiment. FIG. 5 illustrates a case in which the processing container 20 is viewed from above in the state in which the gas supplier 4 (to be described later) is removed. As illustrated in FIG. 5, a manifold 36 is arranged in the center of the substrate processing apparatus 2. The manifold 36 includes a plurality of exhaust paths 361, which are connected to the processing spaces S1 to S4, respectively. Each exhaust path 361 is connected to a hole 351 in a thrust nut 35 (to be described later) below the center of the manifold 36. Each exhaust path 361 is connected to an annular flow path 363 in each of the guide members 362 provided above the processing spaces S1 to S4. That is, the gas in the processing spaces S1 to S4 is exhausted to a joined exhaust port 205 (to be described later) via the flow path 363, the exhaust paths 361, and the hole 351.

Figure 6:
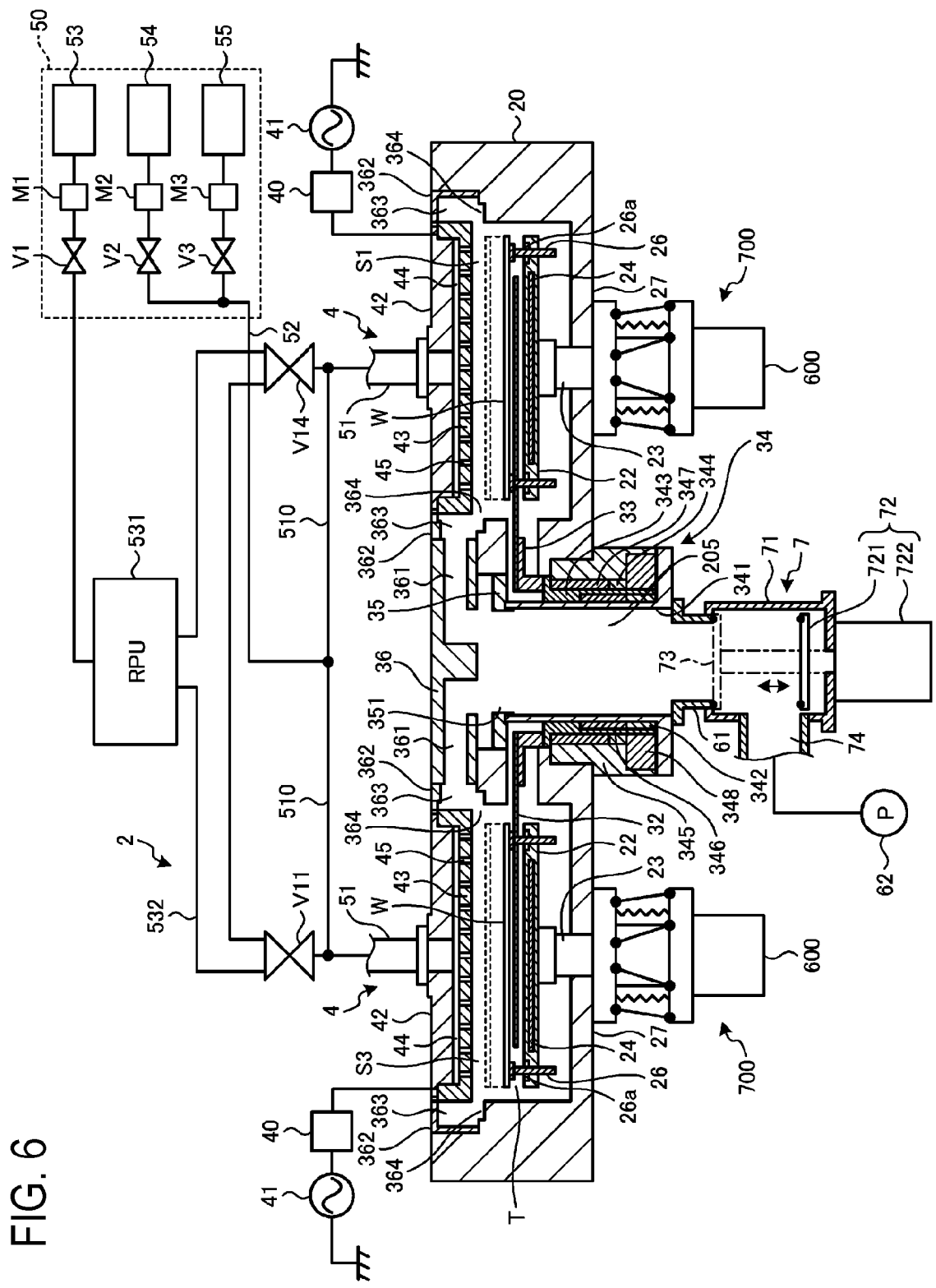
FIG. 6 is a schematic cross-sectional view illustrating an example of a configuration of the substrate processing apparatus of the embodiment.

FIG. 6 is a schematic cross-sectional view illustrating an example of a configuration of the substrate processing apparatus of the present embodiment. The cross section of FIG. 6 corresponds to the cross section of the substrate processing apparatus 2 taken along line A-A in FIG. 5. The four processing spaces S1 to S4 are configured in the same manner as one another, and are formed between the stages 22, on which the wafers W are respectively placed, and the gas suppliers 4 disposed to face the stages 22. In other words, in the processing container 20, the stage 22 and the gas supplier 4 are provided for each of the four processing spaces S1 to S4. FIG. 6 illustrates the processing spaces S1 and S3. Hereinafter, the processing space S1 will be described as an example.

The stage 22 also serves as a lower electrode, is made of, for example, a metal or aluminum nitride (AlN) in which a metal mesh electrode is embedded, and is formed in a flat column shape. The stage 22 is supported by a support member 23 from the bottom side. The support member 23 is formed in a cylindrical shape, extends vertically downward, and penetrates a bottom 27 of the processing container 20. A lower end portion of the support member 23 is located outside the processing container 20 and connected to a rotational driving mechanism 600. The support member 23 is rotated by the rotational driving mechanism 600. The stage 22 is configured to be rotatable with the rotation of the support member 23. An adjustment mechanism 700 is provided at the lower end portion of the support member 23 to adjust the position and inclination of the stage 22. The stage 22 is configured to be capable of being raised and lowered between a processing position and a delivery position using the support member 23 by the adjustment mechanism 700. In FIG. 6, the stage 22 located at the delivery position is indicated by a solid line, and the stage 22 located at the processing position is indicated by a broken line. In addition, at the delivery position, the end effector 32 is inserted between the stage 22 and the wafer W to receive the wafer W from the lift pins 26. The processing position is a position when substrate processing (e.g., a film forming process) is performed, and the delivery position is a position at which the wafer W is delivered to and from a substrate transfer mechanism (not illustrated) or the end effector 32.

A heater 24 is embedded in each stage 22. The heater 24 heats each wafer W placed on the stage 22 to, for example, about 60 degrees C. to 600 degrees C. In addition, the stage 22 is connected to a ground potential.

In addition, the stage 22 is provided with a plurality of (e.g., three) pin through-holes 26a, and the lift pins 26 are arranged inside these pin through-holes 26a, respectively. The pin through-holes 26a are provided to penetrate the stage 22 from a placement surface (upper surface) of the stage 22 to a rear surface (bottom surface) opposite to the placement surface. The lift pins 26 are slidably inserted into the respective pin through-holes 26a. Upper ends of the lift pins 26 are suspended at placement-surface sides of the pin through-holes 26a. That is, the upper ends of the lift pins 26 have a diameter larger than those of the pin through-holes 26a, and recesses having a diameter and a thickness larger than those of the upper ends of the lift pins 26 are formed at the upper ends of the pin through-holes 26a to be capable of accommodating the upper ends of the lift pins 26, respectively. As a result, the upper ends of the lift pins 26 are engaged with the stage 22 and suspended at the placement-surface sides of the pin through-holes 26a, respectively. In addition, the lower ends of the lift pins 26 protrude from the rear surface of the stage 22 toward the bottom 27 of the processing container 20 so as to be capable of coming into contact with a lifting mechanism (not illustrated).

In the state in which the stage 22 is raised to the processing position, the upper ends of the lift pins 26 are received in the recesses at the placement-surface sides of the pin through-holes 26a, respectively. In this state, when the stage 22 is lowered to the transfer position and the lift pins 26 are raised by the lifting mechanism (not illustrated), the upper ends of the lift pins 26 protrude from the placement surface of the stage 22.

The gas supplier 4 is provided in a ceiling portion of the processing container 20 and above the stage 22 via a guide member 362 made of an insulating member. The gas supplier 4 has a function as an upper electrode. The gas supplier 4 includes a lid 42, a shower plate 43 forming a facing surface provided to face the placement surface of the stage 22, and a gas flow chamber 44 formed between the lid 42 and the shower plate 43. A gas supply pipe 51 is connected to the lid 42, and gas ejection holes 45 penetrating the shower plate 43 in the thickness direction are arranged vertically and horizontally in the shower plate 43 such that the gas is ejected toward the stage 22 in the form of a shower.

Each gas supplier 4 is connected to a gas supply system 50 via a gas supply pipe 51. The gas supply system 50 includes, for example, sources of a reaction gas (a film forming gas), a purge gas, and a cleaning gas, which are processing gases, a pipe, a valve V, a flow rate adjuster M, and the like. The gas supply system 50 includes, for example, a cleaning gas source 53, a reaction gas source 54, a purge gas source 55, valves V1 to V3 provided in the pipes of respective gas sources, and flow rate adjusters M1 to M3.

The cleaning gas source 53 is connected to a cleaning gas supply path 532 via the flow rate adjuster M1, the valve V1, and a remote plasma unit (RPU) 531. The cleaning gas supply path 532 branches into four systems at the downstream side of the RPU 531 to be connected to each gas supply pipe 51. Valves V11 to V14 are provided for respective branched pipes at the downstream side of the RPU 531. The respective valves V11 to V14 are opened during cleaning. For the sake of convenience in illustration, only the valves V11 and V14 are illustrated in FIG. 6.

Figure 7:
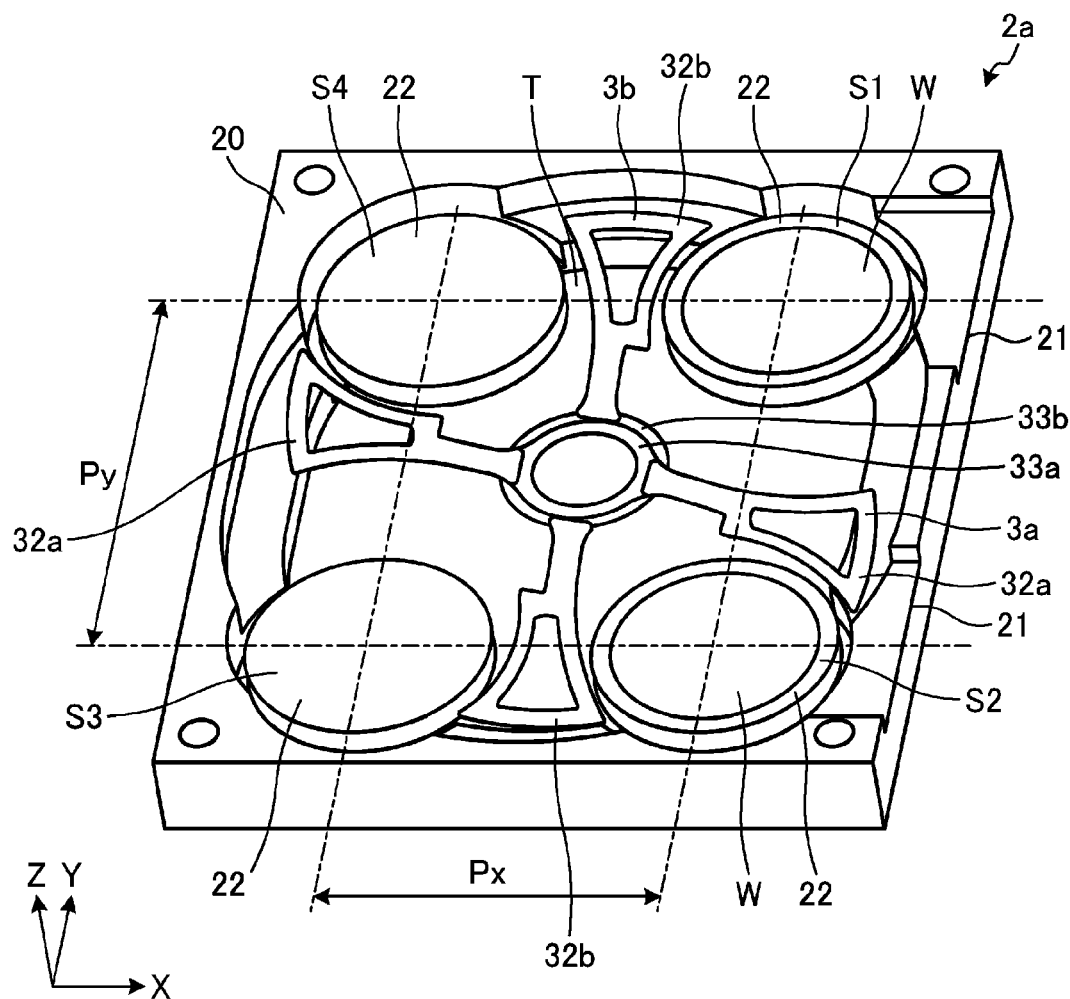
FIG. 7 is an exploded perspective view illustrating an example of a configuration of a substrate processing apparatus according to Modification 1.

The reaction gas source 54 and the purge gas source 55 are connected to a gas supply path 52 via the flow rate adjusters M2 and M3, respectively, and the valves V2 and V3, respectively. The gas supply path 52 is connected to the gas supply pipe 51 via the gas supply pipe 510. In FIG. 7, the gas supply path 52 and the gas supply pipe 510 collectively illustrate respective supply paths and respective supply pipes corresponding to respective gas suppliers 4.

A radio-frequency power supply 41 is connected to the shower plate 43 via a matcher 40. The shower plate 43 has a function as an upper electrode facing the stage 22. When radio-frequency power is applied between the shower plate 43, which is the upper electrode, and the stage 22, which is the lower electrode, it is possible to plasmarize a gas supplied from the shower plate 43 to the processing space S1 (a reaction gas in this example) by capacitive coupling.

Next, the exhaust paths from the processing spaces S1 to S4 to the joined exhaust port 205 will be described. As illustrated in FIGS. 5 and 6, the exhaust paths pass through respective exhaust paths 361 from the annular flow paths 363 in respective guide members 362 provided above the processing spaces S1 to S4, and are directed to a joined exhaust port 205 via a junction portion and the hole 351 below the center of the manifold 36. The exhaust paths 361 have, for example, a circular cross section.

Around each of the processing spaces S1 to S4, a guide member 362 used for exhaust is provided to surround each of the processing spaces S1 to S4. The guide member 362 is, for example, an annular body, which is provided to surround a region around the stage 22 located at the processing position with an interval from the stage 22. The guide member 362 is configured to form therein a flow path 363 having, for example, a rectangular vertical cross section and an annular shape in a plan view. In FIG. 5, the processing spaces S1 to S4, the guide members 362, the exhaust paths 361, and the manifold 36 are schematically illustrated.

The guide members 362 form slit-shaped slit exhaust ports 364, which are open toward respective processing spaces S1 to S4. In this way, the slit exhaust ports 364 are formed in the side peripheral portions of respective processing spaces S1 to S4 in the circumferential direction. The exhaust paths 361 are connected to the flow paths 363, and the processing gas exhausted from the slit exhaust ports 364 is allowed to flow toward the junction portion and the hole 351 below the center of the manifold 36.

As illustrated in FIG. 5, the set of processing spaces S1 and S2 and the set of processing spaces S3 and S4 are arranged rotationally symmetrically by 180 degrees around the manifold 36 when viewed from the above. As a result, processing-gas flow paths extending from respective processing spaces S1 to S4 to the hole 351 via the slit exhaust ports 364, the flow paths 363 in the guide members 362, and the exhaust paths 361 are formed rotationally symmetrically by 180 degrees to surround the hole 351.

The hole 351 is connected to the exhaust pipe 61 via the joined exhaust port 205 inside a thrust pipe 341 of a biaxial vacuum seal 34 arranged in the central portion of the processing container 20. The exhaust pipe 61 is connected to a vacuum pump 62 constituting a vacuum exhaust mechanism via a valve mechanism 7. One vacuum pump 62 is provided in, for example, one processing container 20, and the exhaust pipes at the downstream sides of respective vacuum pumps 62 are joined and are connected to, for example, a factory exhaust system.

The valve mechanism 7 opens and closes the processing-gas flow path formed in each exhaust pipe 61, and includes, for example, a casing 71 and an opening/closing part 72. A first opening 73 connected to the exhaust pipe 61 located at the upstream side is formed in the upper surface of the casing 71, and a second opening 74 connected to the exhaust pipe 61 located at the downstream side is formed in the side surface of the casing 71.

The opening/closing part 72 includes, for example, an opening/closing valve 721 formed to have such a size as to close the first opening 73, and a lifting mechanism 722 provided outside the casing 71 so as to raise and lower the opening/closing valve 721 inside the casing 71. The opening/closing valve 721 is configured to be capable of being raised and lowered between a closing position (indicated by the alternating long and short dash line in FIG. 6) at which the first opening 73 is closed and an opening position (indicated by the solid line in FIG. 6) displaced below the first and second openings 73. When the opening/closing valve 721 is located at the closing position, the downstream end of the joined exhaust port 205 is closed, and the exhaust of the interior of the processing container 20 is stopped. In addition, when the opening/closing valve 721 is located at the opening position, the downstream end of the joined exhaust port 205 is opened and the interior of the processing container 20 is exhausted.

Next, the biaxial vacuum seal 34 and the thrust nut 35 will be described. The biaxial vacuum seal 34 includes a thrust pipe 341, bearings 342 and 344, a rotor 343, a main body 345, magnetic fluid seals 346 and 347, and a direct drive motor 348.

The thrust pipe 341 is a non-rotating central axis and receives a thrust load applied to the upper center of the substrate processing apparatus 2 via the thrust nut 35. That is, the thrust pipe 341 receives a vacuum load applied to the central portion of the substrate processing apparatus 2 when the interiors of the processing spaces S1 to S4 become a vacuum atmosphere, thereby suppressing the deformation of the upper portion of the substrate processing apparatus 2. The thrust pipe 341 has a hollow structure, and the interior of the thrust pipe 341 forms the joined exhaust port 205. The upper surface of the thrust pipe 341 is in contact with the bottom surface of the thrust nut 35. In addition, the inner surface of the upper portion of the thrust pipe 341 and the outer surface of a convex portion at the inner peripheral side of the thrust nut 35 are sealed by an O-ring (not illustrated). The lower surface of the thrust pipe 341 is fixed to the main body 345 by bolts (not illustrated).

The outer peripheral side surface of the thrust nut 35 has a screw structure, and the thrust nut 35 is screwed to a partition wall of the central portion of the processing container 20. The manifold 36 is provided above the central portion of the processing container 20. The thrust load is received by the manifold 36, the partition wall in the central portion of the processing container 20, the thrust nut 35, and the thrust pipe 341. The lower surface of the manifold 36 is brought into partial contact with the upper surface of the thrust nut 35.

The bearing 342 is a radial bearing that holds the rotor 343 at the side of the thrust pipe 341. The bearing 344 is a radial bearing that holds the rotor 343 at the side of the main body 345. The rotor 343 is arranged concentrically with the thrust pipe 341 and is a rotation axis in the center of the rotation arm 3. In addition, the base member 33 is connected to the rotor 343. When the rotor 343 rotates, the rotation arm 3, that is, the end effectors 32 and the base member 33, rotates.

The main body 345 accommodates therein the bearings 342 and 344, the rotor 343, the magnetic fluid seals 346 and 347, and the direct drive motor 348. The magnetic fluid seals 346 and 347 are arranged at the inner peripheral side and the outer peripheral side of the rotor 343, and seal the processing spaces S1 to S4 from the outside. The direct drive motor 348 is connected to the rotor 343, and drives the rotor 343 to rotate the rotation arm 3. Further, the main body 345 is fixed to the bottom portion 27 (bottom surface) of the processing container 20 by bolts (not illustrated), and the thrust load applied to the thrust pipe 341 is received by the processing container 20 via the main body 345.

In other words, the rotor 343 is an example of a rotation cylinder having a hollow interior, and corresponds to the outer cylinder of the biaxial vacuum seal 34, which is an example of a coaxial magnetic fluid seal. The rotor 343 is disposed at a location equidistant from each of the processing spaces S1 to S4. Meanwhile, the thrust pipe 341 is disposed in the hollow portion at the inner periphery side of the rotor 343, and the joined exhaust port 205 inside the thrust pipe 341 is an example of the exhaust path and corresponds to the inner cylinder of the biaxial vacuum seal 34. The upper surface of the thrust pipe 341 is fixed to the partition wall in the central portion of the processing container 20, that is, the upper wall of the processing container 20 via the thrust nut 35. That is, the thrust pipe 341 supports the manifold 36 against the bottom wall (the bottom portion 27) of the processing container 20, via the partition wall in the central portion of the processing container 20 and the thrust nut 35.

In this way, in the biaxial vacuum seal 34, the thrust pipe 341, which is the non-rotating central axis as a first axis, serves as a gas exhaust pipe while supporting the load of the upper portion of the processing container 20, and the rotor 343 as a second axis serves to rotate the rotation arm 3.

[Modification 1]

In the embodiments described above, the rotation arm 3 is rotated clockwise by 180 degrees to transfer the wafer W in the processing space S1 to the processing space S3 and to transfer the wafer W in the processing space S2 to the processing space S4. However, the rotation arm 3 may be divided into two arms which may rotate independently from each other. This embodiment will be described as Modification 1.

FIG. 7 is an exploded perspective view illustrating an example of a configuration of a substrate processing apparatus in Modification 1. As illustrated in FIG. 7, a substrate processing apparatus 2a of Modification 1 includes rotation arms 3a and 3b, instead of the rotation arm 3 of the embodiment. Although not illustrated, the substrate processing apparatus 2a includes a triaxial vacuum seal, instead of the biaxial vacuum seal 34. Since the configuration of the substrate processing apparatus 2a of Modification 1 is the same as that of the substrate processing apparatus 2 of the embodiment, except for the rotation arms 3a and 3b and the triaxial vacuum seal that drives the rotation arms 3a and 3b, descriptions thereof will be omitted.

The rotation arm 3a includes two end effectors 32a capable of holding wafers W to be placed on two stages 22 (the set of processing spaces S1 and S3 or the set of processing spaces S2 and S4), respectively, which are rotationally symmetric with respect to the center position of the two-row and two-column layout, among the stages 22, and a base member 33a the rotation axis of which is located at the center position of the two-row and two-column layout. The two end effectors 32a are connected to the base member 33a to be rotationally symmetric with each other, that is, to be linearly arranged.

Similarly to the rotation arm 3a, the rotation arm 3b includes two end effectors 32b capable of holding wafers W to be placed on the two stages 22 (the set of processing spaces S1 and S3 or the set of processing spaces S2 and S4), respectively, which are rotationally symmetric with respect to the center position of the two-row two-column layout, among the stages 22, and a base member 33b, the rotation axis of which is located at the center position of the two-row and two-column layout. The two end effectors 32b are connected to the base member 33b to be rotationally symmetric with each other, that is, to be linearly arranged.

The triaxial vacuum seal is an example of a coaxial magnetic fluid seal in which a rotation axis corresponding to the rotor 343 of the biaxial vacuum seal 34 is divided into two first and second rotation cylinders rotatable independently of each other. The first and second rotation cylinders are arranged coaxially with the thrust pipe 341. The second rotation cylinder is disposed outside the first rotation cylinder. That is, the first rotation cylinder is an example of a first outer cylinder of the triaxial vacuum seal, and the second rotation cylinder is an example of a second outer cylinder of the triaxial vacuum seal.

In the substrate processing apparatus 2a, for example, the rotation arm 3a is connected to the first rotation cylinder, and the rotation arm 3b is connected to the second rotation cylinder. As a result, the rotation arms 3a and 3b are rotatable independently of each other. That is, by rotating the rotation arms 3*a* and 3*b* at different rotation angles, it is possible to transfer wafers W between adjacent processing spaces (reactors) even when the pitches Px and Py of the stages 22 are different from each other. That is, in the substrate processing apparatus 2*a*, wafers W can be transferred, for example, from the processing space S1 to the processing space S2, from the processing space S2 to the processing space S3, from the processing space S3 to the processing space S4, or from the processing space S4 to the processing space S1.

[Modification 2]

In the embodiment described above, the inner wall of the thrust pipe 341 serves as the wall surface of the joined exhaust port 205. However, a gas pipe having a heater may be provided inside the thrust pipe 341. This embodiment will be described as Modification 2.

Figure 8:
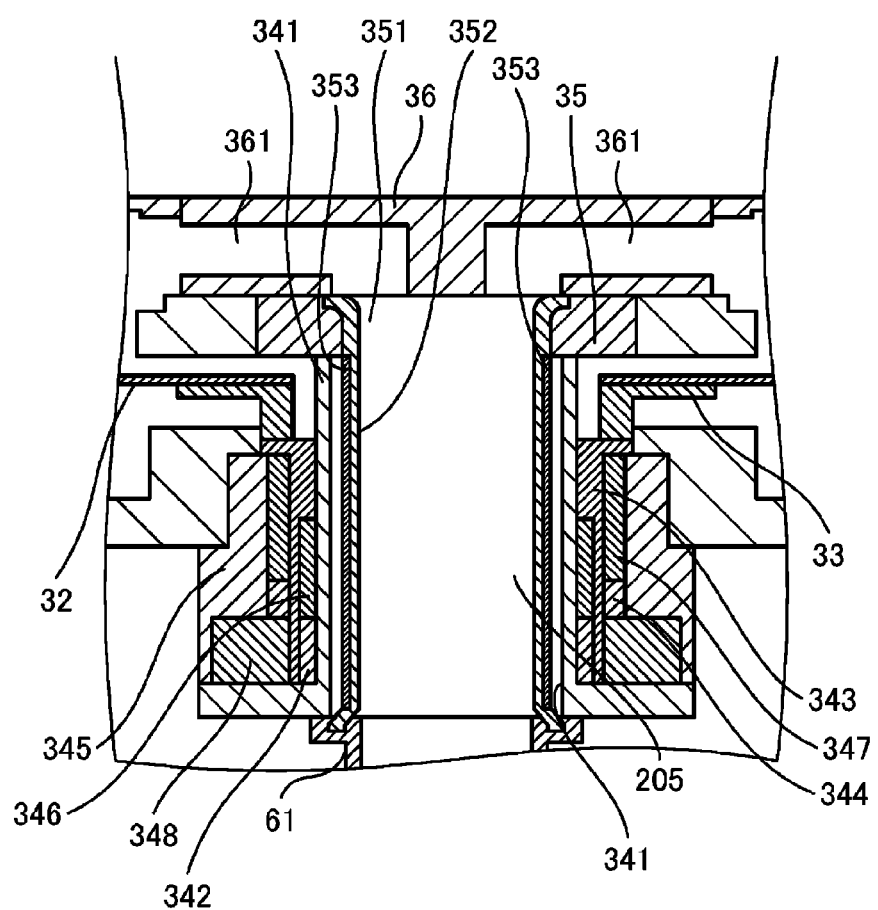
FIG. 8 is a partial enlarged view illustrating an example of a cross section of the vicinity of a joined exhaust port according to Modification 2.

FIG. 8 is a partial enlarged view illustrating an example of a cross section of the vicinity of the joined exhaust port in Modification 2. As illustrated in FIG. 8, in Modification 2, a gas pipe 352 is provided inside the thrust pipe 341. That is, the gas pipe 352 is the innermost cylinder disposed more inward of the thrust pipe 341 that corresponds to the inner cylinder of the coaxial magnetic fluid seal. The gas pipe 352 has a hollow structure, and the interior of the gas pipe 352 forms the joined exhaust port 205. A sheet-shaped heater 353 is provided on the outer side surface of the gas pipe 352. The gas pipe 352 does not rotate like the thrust pipe 341. The upper outer periphery side of the gas pipe 352 is in contact with the inner periphery side of the thrust nut 35. A space between the outer surface of the upper portion of the gas pipe 352 and the inner peripheral surface of the thrust nut 35 is sealed by an O-ring (not illustrated). The lower portion of the gas pipe 352 is in contact with the upper portion of the exhaust pipe 61 via a heat insulator (not illustrated), and is sealed by an O-ring (not illustrated).

The heater 353 uniformly heats the gas pipe 352 to a temperature of, for example, 180 degrees C. By performing the heating control of the gas pipe 352 using the heater 353, the adhesion of deposits to the inner wall of the gas pipe 352 (facing the joined exhaust port 205 side) can be suppressed. The heater 353 is provided with a plurality of control regions to be able to heat only portions desired to be heated. When heating the gas pipe 352, the heater 353 also heats the thrust pipe 341 by radiation. Since the temperature of the thrust pipe 341 rises due to the radiation heating by the heater 353, the adhesion of deposits to the surface (outer surface) of the thrust pipe 341 facing the processing spaces S1 to S4 may be suppressed.

That is, in Modification 2, one axis of the rotor 343 among the three axes is rotatable, and the two axes of the thrust pipe 341 and the gas pipe 352 are fixed, at the center of the processing container 20. The gas pipe 352 and the heater 353 in Modification 2 may be combined with the triaxial vacuum seal of Modification 1 to implement four axes. In this case, in the central portion of the processing container 20, among the four axes, the two axes of the first and second rotation cylinders that correspond to the rotation arms 3*a* and 3*b* are rotatable, and the other two axes of the thrust pipe 341 and the gas pipe 352 are fixed.

In addition, in the above-described embodiments, the direct drive motor 348 is used as a method of driving the rotor 343 in the biaxial vacuum seal 34, but the present disclosure is not limited thereto. For example, the rotor 343 may be provided with a pulley and may be driven using a timing belt from a motor provided outside the biaxial vacuum seal 34. A gear driving may be used by fitting a gear provided in the rotor 343, which is the outer cylinder, with a gear of a motor provided outside. Similarly, in the method of driving the first and second rotation cylinders in the triaxial vacuum seal, any of the driving by the direct drive motor, the driving by the timing belt, and the driving by the gear may be used.

As described above, according to the embodiments of the present disclosure, the substrate processing apparatus 2 includes the vacuum processing container (the processing container 20) and the rotation arm 3 having a rotation axis located at the center (central region) of the vacuum processing container. In the rotation arm 3, the rotation cylinder having a hollow interior (the rotor 343) constitutes the rotary axis, and the hollow portion of the rotation cylinder constitutes an exhaust path (the joined exhaust port 205) of the vacuum processing container. As a result, it is possible to achieve both the installation of the rotation mechanism of the rotation arm 3 (the rotor 343 and the direct drive motor 348) in the central portion of the vacuum processing container and the simplification of the exhaust path.

In addition, according to the embodiments, the rotation cylinder is configured with the outer cylinder (the rotor 343) of the coaxial magnetic fluid seal (the biaxial vacuum seal 34), and the exhaust path is configured with the inner cylinder (the thrust pipe 41) of the coaxial magnetic fluid seal. As a result, it is possible to achieve both the installation of the rotation mechanism of the rotation arm 3 in the central portion of the vacuum processing container and the simplification of the exhaust path.

According to the embodiments, the rotation cylinder is configured with the outer cylinder of the coaxial magnetic fluid seal, and the exhaust path is configured with the innermost cylinder (the gas pipe 352) disposed more inward of the inner cylinder of the coaxial magnetic fluid seal. As a result, the adhesion of deposits to the inner cylinder of the coaxial magnetic fluid seal can be suppressed.

According to the embodiments, the rotation cylinder includes the first and second rotation cylinders, the outer cylinder includes the first outer cylinder and the second outer cylinder disposed outside the first outer cylinder, the first rotation cylinder is configured with the first outer cylinder, and the second rotation cylinder is configured with the second outer cylinder. As a result, even when the pitches Px and Py of the plurality of processing spaces (reactors) are different from one another, wafers W can be transferred between adjacent processing spaces.

According to the embodiments, the first and second outer cylinders are rotatable independently of each other. As a result, even when the pitches Px and Py of the plurality of processing spaces (reactors) are different from one another, wafers W can be transferred between adjacent processing spaces.

According to the embodiments, the lower end of the inner cylinder is fixed to the bottom wall of the vacuum processing container, and the upper end of the inner cylinder is fixed to the upper wall of the vacuum processing container. As a result, the deformation of the vacuum processing container can be suppressed. The bottom wall and the upper wall to which the inner cylinder is fixed are not limited strictly to the bottom wall and the upper wall. For example, in addition to a case in which the inner cylinder is fixed directly to the bottom wall and the upper wall, a case in which the inner cylinder is indirectly fixed to the bottom wall and the upper wall via an intermediate member between the inner cylinder and the bottom wall/the upper wall may also be included as long as the load of the upper wall is supported by the bottom wall via the inner cylinder.

According to the embodiments, the plurality of processing spaces S1 to S4 are formed inside the vacuum processing container, and the rotation axis is disposed at a location equidistant from each of the plurality of processing spaces S1 to S4. As a result, wafers W can be transferred among the processing spaces S1 to S4 using the rotation arm 3.

According to the embodiments, the rotation arm 3 includes the end effectors 32 capable of holding the same number of wafers W as that of the plurality of processing spaces S1 to S4. As a result, the wafers W in the respective processing spaces S1 to S4 can be transferred at the same time.

According to the embodiments, the vacuum processing container includes the exhaust manifold (the manifold 36) for connecting the plurality of processing spaces S1 to S4 to the exhaust path, and the inner cylinder of the coaxial magnetic fluid seal supports the exhaust manifold against the bottom wall. As a result, the deformation of the vacuum processing container can be suppressed.

According to the embodiments, the rotation cylinder rotates when the outer cylinder of the coaxial magnetic fluid seal is driven by the direct drive motor 348. As a result, the driving part of the rotation arm 3 can be miniaturized.

According to the embodiments, the innermost cylinder is heated by the heater 353. As a result, the adhesion of deposits to the inner wall of the gas pipe 352 can be suppressed.

According to the embodiments, the inner cylinder is heated by the heater 353 through radiation. As a result, the adhesion of deposits to the surface of the inner cylinder (the thrust pipe 341) that faces the processing spaces S1 to S4 can be suppressed.

According to the embodiments, the lower end of the innermost cylinder is fixed to the exhaust pipe 61 of the exhaust path, and the upper end of the innermost cylinder is fixed to the upper wall of the vacuum processing container. As a result, the adhesion of deposits in the exhaust path (the joined exhaust port 205) up to the exhaust pipe 61 can be suppressed.

According to the present disclosure, it is possible to achieve both installation of a rotation mechanism of a rotation arm in a central portion of a vacuum processing container and simplification of an exhaust path.

It should be understood that the embodiments disclosed herein are illustrative and are not limiting in all aspects. The above-described embodiments may be omitted, replaced, or modified in various forms without departing from the scope and spirit of the appended claims.

For example, in the embodiments described above, an example in which the substrate processing apparatus 2 is an apparatus that performs a plasma CVD process as substrate processing has been described, but the technique disclosed herein may be applied to any apparatus that performs other substrate processing such as plasma etching.

What is claimed is:

1. A substrate processing apparatus comprising:
   a vacuum processing container; and
   a rotation arm including a rotary axis disposed at a central portion of the vacuum processing container,
   wherein, in the rotation arm, a rotation cylinder having a hollow interior constitutes the rotary axis, and a hollow portion of the rotation cylinder constitutes an exhaust path of the vacuum processing container,
   wherein the rotation cylinder is configured with an outer cylinder of a coaxial magnetic fluid seal,
   wherein the exhaust path is configured with an inner cylinder of the coaxial magnetic fluid seal, and
   wherein the inner cylinder of the coaxial magnetic fluid seal receives a vacuum load applied to the vacuum processing container.

2. The substrate processing apparatus of claim 1, wherein the rotation cylinder includes a first rotation cylinder and a second rotation cylinder,
   the outer cylinder includes a first outer cylinder and a second outer cylinder disposed outside the first outer cylinder,
   the first rotation cylinder is configured with the first outer cylinder, and
   the second rotation cylinder is configured with the second outer cylinder.

3. The substrate processing apparatus of claim 2, wherein the first outer cylinder and the second outer cylinder are configured to rotate independently of each other.

4. The substrate processing apparatus of claim 3, wherein a lower end of the inner cylinder is fixed to a bottom wall of the vacuum processing container, and
   an upper end of the inner cylinder is fixed to an upper wall of the vacuum processing container.

5. The substrate processing apparatus of claim 4, wherein the vacuum processing container includes a plurality of processing spaces formed therein, and
   the rotary axis is disposed at a location equidistant from each of the plurality of processing spaces.

6. The substrate processing apparatus of claim 5, wherein the rotation arm includes end effectors configured to hold a same number of wafers as a number of the plurality of processing spaces.

7. The substrate processing apparatus of claim 6, wherein the vacuum processing container includes an exhaust manifold configured to connect the plurality of processing spaces to the exhaust path, and
   the inner cylinder of the coaxial magnetic fluid seal supports the exhaust manifold against the bottom wall.

8. The substrate processing apparatus of claim 7, wherein the rotation cylinder is configured to rotate when the outer cylinder of the coaxial magnetic fluid seal is driven by a direct drive motor or a gear.

9. A substrate processing apparatus comprising:
   a vacuum processing container; and
   a rotation arm including a rotary axis disposed at a central portion of the vacuum processing container,
   wherein, in the rotation arm, a rotation cylinder having a hollow interior constitutes the rotary axis, and a hollow portion of the rotation cylinder constitutes an exhaust path of the vacuum processing container,
   wherein the rotation cylinder is configured with an outer cylinder of a coaxial magnetic fluid seal,
   wherein the exhaust path is configured with an innermost cylinder disposed more inward than an inner cylinder of the coaxial magnetic fluid seal, and
   wherein at least one of the innermost cylinder of the coaxial magnetic fluid seal or the inner cylinder of the coaxial magnetic fluid seal receives a vacuum load applied to the vacuum processing container.

10. The substrate processing apparatus of claim 9, wherein the innermost cylinder is heated by a heater.

11. The substrate processing apparatus of claim 10, wherein the inner cylinder is heated by the heater through radiation.

12. The substrate processing apparatus of claim 11, wherein a lower end of the innermost cylinder is fixed to an exhaust pipe of the exhaust path, and
   an upper end of the innermost cylinder is fixed to an upper wall of the vacuum processing container.

13. The substrate processing apparatus of claim 9, wherein a lower end of the innermost cylinder is fixed to an exhaust pipe of the exhaust path, and an upper end of the innermost cylinder is fixed to an upper wall of the vacuum processing container.

\* \* \* \* \*